(12) United States Patent
Liang et al.

(10) Patent No.: US 11,917,904 B2
(45) Date of Patent: Feb. 27, 2024

(54) PEROVSKITE SOLAR CELL

(71) Applicant: CONTEMPORARY AMPEREX TECHNOLOGY CO., LIMITED, Fujian (CN)

(72) Inventors: Weifeng Liang, Fujian (CN); Wenming Guo, Fujian (CN); Juanjuan Sun, Fujian (CN); Bo Luan, Fujian (CN); Yongsheng Guo, Fujian (CN); Guodong Chen, Fujian (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 18/220,832

(22) Filed: Jul. 12, 2023

(65) Prior Publication Data
US 2023/0354696 A1    Nov. 2, 2023

Related U.S. Application Data

(63) Continuation of application No. PCT/CN2022/078287, filed on Feb. 28, 2022.

(51) Int. Cl.
*H10K 85/50* (2023.01)
*H10K 30/50* (2023.01)
(Continued)

(52) U.S. Cl.
CPC .......... *H10K 85/50* (2023.02); *H10K 30/86* (2023.02); *H10K 71/15* (2023.02); *H10K 85/111* (2023.02); *H10K 30/50* (2023.02)

(58) Field of Classification Search
None
See application file for complete search history.

(56) References Cited

FOREIGN PATENT DOCUMENTS

| CN | 106062983 B | 3/2019 |
|---|---|---|
| CN | 110518127 A | 11/2019 |

(Continued)

OTHER PUBLICATIONS

Foong et al., ChemSusChem, 2021, 14, 1524-1533. (Year: 2021).*

(Continued)

*Primary Examiner* — Eli S Mekhlin
(74) *Attorney, Agent, or Firm* — XSENSUS LLP

(57) ABSTRACT

The present application provides a perovskite solar cell, including conductive glass, a hole transport layer, a perovskite layer, an electron transport layer and a back electrode, where a passivation layer may be disposed between the hole transport layer and the perovskite layer, and the passivation layer may include an amide and/or a cation thereof, where the amide may include a compound of formula (1) and/or formula (2):

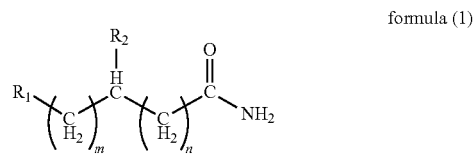

formula (1)

where
$R_1$ and $R_2$ are each independently selected from hydrogen, —R, —$NR_2$, —NHR, —$NH_2$, —OH, —OR, —NHCOR, —OCOR, and —$CH_2COOH$, where R represents a straight or branched chain alkyl group having 1-10 carbon atoms, m is an integer of 0 to 10; and n is an integer of 1 to 10; and (Continued)

formula (2)

$$Ar-\overset{\overset{O}{\|}}{C}-NH_2$$

where Ar is selected from a C5-C10 aryl or heteroaryl group.

16 Claims, 1 Drawing Sheet

(51) Int. Cl.
*H10K 30/86* (2023.01)
*H10K 71/15* (2023.01)
*H10K 85/10* (2023.01)

(56) References Cited

FOREIGN PATENT DOCUMENTS

| CN | 110635039 B | 1/2021 |
| CN | 112582543 A | 3/2021 |
| CN | 112864325 A | 5/2021 |
| CN | 114014840 A | 2/2022 |

OTHER PUBLICATIONS

International Search Report and Written Opinion dated Nov. 11, 2022, received for PCT Application PCT/CN2022/078287, filed on Feb. 28, 2022, 13 pages including English Translation.

* cited by examiner

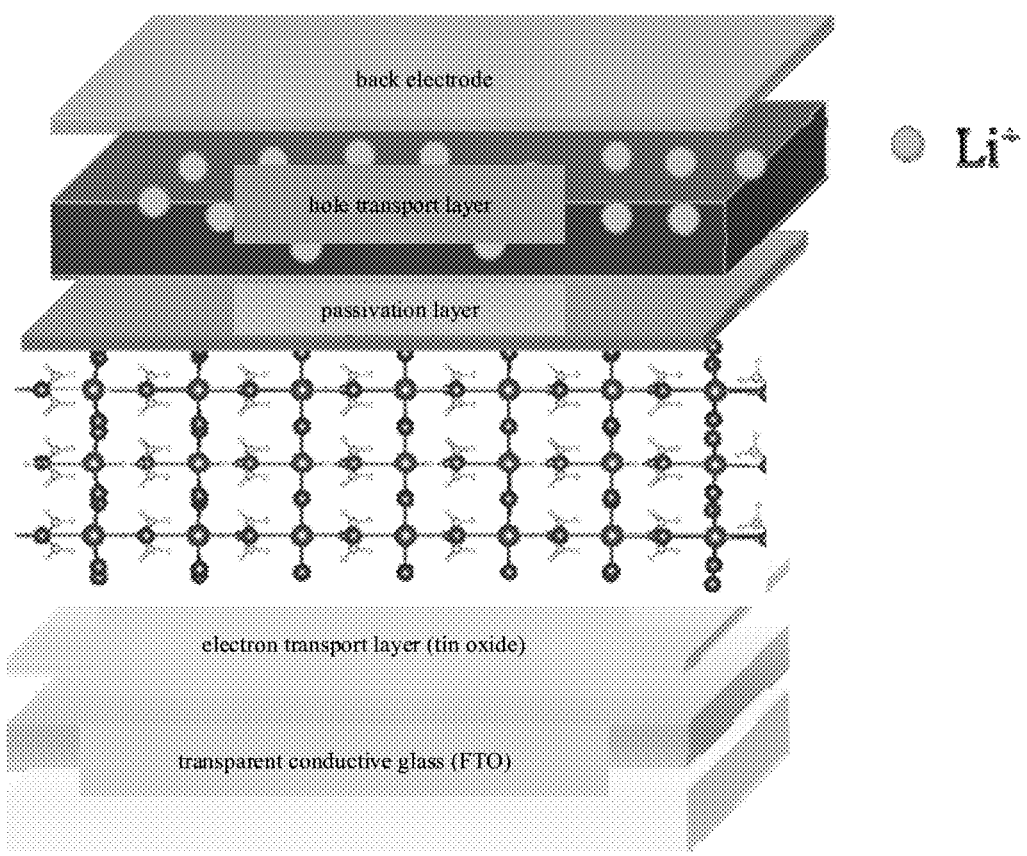

PEROVSKITE SOLAR CELL

CROSS-REFERENCE TO RELATED APPLICATION

The present application is a continuation of International Application No. PCT/CN2022/078287, filed Feb. 28, 2022, which is incorporated herein by reference in its entirety.

TECHNICAL FIELD

The present application belongs to the technical field of perovskite solar cells, and in particular relates to an interface passivation material for a perovskite solar cell. In addition, the present application further relates to a perovskite solar cell including the interface passivation material.

BACKGROUND

With the rapid development of the new energy field, perovskite solar cells are favored due to advantages such as high photoelectric conversion efficiency, simple manufacturing process, as well as low production cost and material cost. A perovskite solar cell generally includes a conductive glass, a hole transport layer, a perovskite layer, an electron transport layer, and a metal back electrode. The perovskite layer typically includes a perovskite material. The perovskite layer usually has many defects on a surface thereof, and therefore a passivation material is often used for passivation.

Although the current passivation materials have certain effects on improving the efficiency and performance of perovskite solar cells, long-term stability of the perovskite solar cells obtained by using these passivation materials is often poor. Therefore, further research and improvement of the perovskite solar cells are still needed.

SUMMARY

The present application is made in view of the above problems, and an object thereof is to provide a perovskite solar cell having high photoelectric conversion efficiency and good long-term stability.

In order to achieve the above object, the present application provides a perovskite solar cell, including conductive glass, a hole transport layer, a perovskite layer, an electron transport layer and a back electrode, where a passivation layer is disposed between the hole transport layer and the perovskite layer, and the passivation layer includes an amide and/or a cation thereof, where the amide includes a compound of formula (1) and/or formula (2):

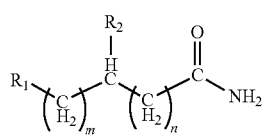

formula (1)

where
$R_1$ and $R_2$ are each independently selected from hydrogen, —R, —$NR_2$, —NHR, —$NH_2$, —OH, —OR, —NHCOR, —OCOR, and —$CH_2COOH$, where R represents a straight or branched chain alkyl group having 1-10 carbon atoms, m is an integer of 0 to 10; and
n is an integer of 1 to 10; and

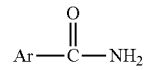

formula (2)

where Ar is selected from a C5-C10 aryl or heteroaryl group, optionally, pyridine, pyran, thiopyran, benzene, naphthalene, quinoline, isoquinoline, pyrrole, pyrazole, pyrimidine, pyrazine, pyridazine, and isoindole.

The use of an amide as a passivation material has at least the following advantages: first, a nitrogen atom on the amide has a strong ability to bind protons, so it is not easy to generate harmful hydrogen vacancy during use, thereby ensuring stability of passivation and efficiency of a device; in addition, oxygen on the amide can be well anchored with lead in perovskite (if there is lead), which fixes the structure of an iodide-lead octahedron, so as to stabilize a perovskite phase. Second, due to p-π conjugation, the amide has a strong electron cloud density, which can stabilize a lithium ion and prevent the lithium ion from migrating into the perovskite, so as to reduce the adverse effect of migration of the lithium ion on the long-term stability of the device.

In any embodiment, the passivation layer includes an amide cation of formula (3),

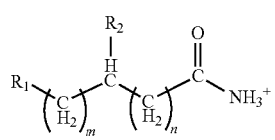

formula (3)

where $R_1$, $R_2$, m, and n are as defined above; and
the passivation layer further includes an organic acid containing N, O, S and/or P, optionally N=O, S=O and/or P=O and/or a polymer of the organic acid, and/or an inorganic acid, and/or one or more anions thereof.

An anion has a certain influence on the passivation effect of an amide material in a perovskite solar cell. Although a common inorganic acid anion with high electronegativity can make up for the defect of an X site in perovskite ($ABX_3$), it will reduce an electron cloud density at the amide due to the strong electronegativity, so that an effect of fixing a lithium ion by the amide declines. However, the inventors of the present application have found that an organic acid containing N, O, S and/or P or a polymer of the organic acid or some specific inorganic acids (such as phosphoric acid and sulfamic acid) is similar to a cation of the amide and has certain effects of passivating defects and stabilizing a perovskite phase; in addition, a lone pair of electrons on N, O, S, and P have a certain effect on fixing a lithium ion, which has a positive impact on the long-term stability of the device. Therefore, optionally, an organic acid containing N, O, S, and P, especially containing N=O, S=O, and P=O, or a polymer of the organic acid or some specific inorganic acids are used in the present application to prepare the passivation layer between the hole transport layer and the perovskite layer.

In any embodiment, a ratio of a molar sum of the amide or the cation thereof to a molar sum of the organic acid and/or the polymer of the organic acid and/or the inorganic acid, and/or the anions thereof is 1:(1.0-1.5), optionally 1:(1.0-1.2).

In any embodiment, the organic acid is selected from at least one of acetic acid, glycolic acid, oxalic acid, citric acid, ethylenediaminetetraacetic acid, maleic acid, acrylic acid, and organic phosphonic acid, and/or the inorganic acid is at least one selected from sulfamic acid and phosphoric acid.

Using the above organic acid and/or inorganic acid to prepare the passivation layer between the hole transport layer and the perovskite layer can achieve better passivation of defects and stabilization of the perovskite phase.

In any embodiment, the passivation layer includes one or more anions having the following structural formulas:

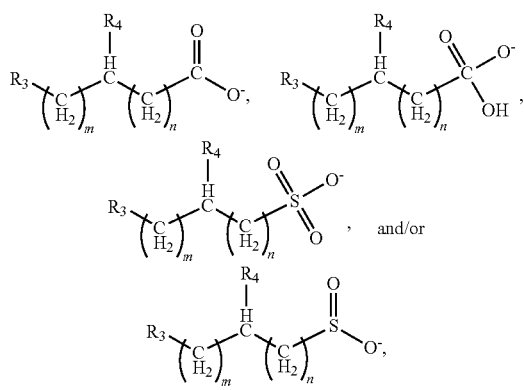

where $R_3$ and $R_4$ are each independently selected from hydrogen or a straight or branched chain alkyl group having 1-10 carbon atoms, m is an integer of 0-10, and n is an integer of 1-10.

In any embodiment, the passivation layer does not include a cyclic group, optionally does not include a benzene ring.

This is because a group having a cyclic structure has a large pore diameter, so that a lithium ion can pass it through and enter the perovskite layer. In the perovskite solar cell described in the present application, the passivation layer between the hole transport layer and the perovskite layer adopts an alkyl chain instead of a group containing a cyclic structure, which can prevent the lithium ion from entering the perovskite layer through the passivation layer.

In any embodiment, the hole transport layer includes 2,2',7,7'-tetrakis[N,N-di(4-methoxyphenyl)amino]-9,9'-spirobifluorene (Spiro-OMeTAD), optionally a weight content of the 2,2',7,7'-tetrakis[N,N-di(4-methoxyphenyl)amino]-9,9'-spirobifluorene is 60-95%, optionally 70-85%, based on a total weight of the entire hole transport layer.

The passivation layer of the present application is especially suitable for use between the hole transport layer including the above Spiro-OMeTAD material and the perovskite layer.

In any embodiment, the hole transport layer includes a lithium salt, optionally, the lithium salt is lithium bis(trifluoromethanesulfonyl)imide, more optionally, a weight content of the lithium salt is 5-30%, optionally 8-15%, based on a total weight of the entire hole transport layer.

In a case that Spiro-OMeTAD is used as a hole transport material, since the material has a limited ability to conduct a hole, a lithium salt is usually added therein. However, solubility of the lithium salt in a solvent where Spiro-OMeTAD is present is low, so 4-tert-butylpyridine (tBP) is often added to increase its solubility. In addition, Spiro-OMeTAD may also be oxidized by adding a cobalt salt for oxidation to improve the ability of hole extraction. Optionally, the cobalt salt is tris[4-tert-butyl-2-(1H-pyrazol-1-yl) pyridine]cobalt (FK209 for short).

In any embodiment, the perovskite solar cell is a formal perovskite solar cell. In the formal perovskite solar cell described in the present application, conductive glass, an electron transport layer, a perovskite layer, a passivation layer, a hole transport layer, and a back electrode (optionally a metal back electrode) are included successively, where the passivation layer is located between the perovskite layer and the hole transport layer. Optionally, the passivation layer may also be disposed between the electron transport layer and the perovskite layer.

A second aspect of the present application provides a method for preparing a perovskite solar cell, the method including a step of preparing a hole transport layer, a step of preparing a perovskite layer, a step of preparing an electron transport layer, and a step of preparing a back electrode, where a passivation layer is disposed between the hole transport layer and the perovskite layer, and preparation of the passivation layer includes the following steps:

step S1: preparing or making a passivation material ready, the passivation material including an amide and/or a cation thereof, where the amide includes a compound of formula (1) and/or formula (2):

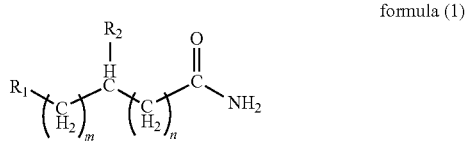

formula (1)

where
$R_1$ and $R_2$ are each independently selected from hydrogen, —R, —NR$_2$, —NHR, —NH$_2$, —OH, —OR, —NHCOR, —OCOR, and —CH$_2$COOH, where R represents a straight or branched chain alkyl group having 1-10 carbon atoms,
m is an integer of 0 to 10; and
n is an integer of 1 to 10; and

formula (2)

where Ar is selected from a C5-C10 aryl or heteroaryl group, optionally, pyridine, pyran, thiopyran, benzene, naphthalene, quinoline, isoquinoline, pyrrole, pyrazole, pyrimidine, pyrazine, pyridazine, and isoindole;

step S2: formulating a solution of the passivation material; and step S3: coating the solution of the passivation material on perovskite, and then performing annealing to obtain the passivation layer.

Optionally, in the step S3, the passivation material is spread on a surface of the perovskite layer by spin coating. In some optional embodiments, a spin coating process includes spinning at a rotational speed of 1000-5000 rpm for 15-40 s. In some optional embodiments, an annealing process includes raising temperature to 80-120° C. and maintaining the annealing under the temperature for 5-30 min.

In any optional embodiment, the preparation of the passivation layer may include the following processes: the solution of the passivation material is added to the perovskite layer dropwise, and the passivation material is spread on a surface of the perovskite layer by spin coating, a spin coating process comprises spinning at a rotational speed of 1000-5000 rpm for 15-40 s, and then the passivation material is placed in a vacuum environment for 5-20 min, and a vacuum degree is optionally 0.01-0.2 MPa.

In any optional embodiment, in the preparation of the passivation layer, no other passivation material is used except the passivation material prepared or made ready in the step S1.

In any embodiment, the step S1 includes the following operations:
(1) dissolving the amide in a solvent and performing stirring in an ice water bath; optionally, maintaining temperature at 0-4° C. during stirring;
(2) adding an organic acid, an inorganic acid and/or a polymer of the organic acid dropwise, optionally, continuing to react for 0.5-3 h after finishing the adding dropwise; and
(3) optionally, drying, washing and drying a reaction product in (2) to obtain the passivation material.

In any embodiment, in the step S2, a solvent for formulating the solution of the passivation material is selected from one or more of ethanol, isopropanol, n-butanol, ethyl acetate, chloroform, chlorobenzene, ethyl butyrate, dichlorobenzene, diethyl ether, toluene, and xylene, optionally, a concentration of the solution of the passivation material for preparing the passivation layer is 0.2-2.5 mg/ml, optionally 0.5-2.0 mg/ml.

BRIEF DESCRIPTION OF THE DRAWINGS

FIG. 1 is a schematic diagram of a structure of a perovskite solar cell prepared in Example 3 of the present application. In the FIGURE, from bottom to top are successively: transparent conductive glass including a glass substrate and fluorine-doped tin oxide (FTO), from which light enters; an electron transport layer adopting tin oxide; a perovskite layer located between a passivation layer and the electron transport layer, in which a circle is used to represent an atom in the FIGURE, and is schematically drawn; the passivation layer adopting a passivation material dodecylamine formate of the present application; a hole transport layer including a lithium ion, in which a circle represents the lithium ion; and a metal back electrode.

DESCRIPTION OF EMBODIMENTS

Hereinafter, embodiments specifically disclosing a solar cell of the present application will be described in detail with reference to drawings as appropriate. However, unnecessarily detailed descriptions may be omitted in some cases. For example, detailed description for a well-known matter and repeated description for a practically identical structure are omitted. This is done to avoid unnecessarily redundant descriptions for ease of understanding by persons skilled in the art. In addition, the drawings and the following description are provided for persons skilled in the art to fully appreciate the present application, and are not intended to limit the subject matters described in the claims.

A "range" disclosed herein is defined in the form of a lower limit and an upper limit. A given range is defined by selecting a lower limit and an upper limit, and the selected lower limit and upper limit define boundaries of a particular range. The range defined in this manner may or may not include end values, and may be combined arbitrarily, that is, any lower limit may be combined with any upper limit to form a range. For example, if ranges of 60-120 and 80-110 are listed for a particular parameter, it is understood that ranges of 60-110 and 80-120 are also anticipated. In addition, if the minimum range values listed are 1 and 2, and the maximum range values listed are 3, 4 and 5, all the following ranges can be anticipated: 1-3, 1-4, 1-5, 2-3, 2-4, and 2-5. In the present application, unless otherwise specified, a numerical range "a-b" represents an abbreviated representation of any combination of real numbers between a and b, where both a and b are real numbers. For example, a numerical range "0-5" means that all real numbers between "0-5" have been listed herein, and "0-5" is just an abbreviated representation of a combination of these numerical values. In addition, when a certain parameter is expressed as an integer ≥2, it is equivalent to disclosing that the parameter is, for example, an integer 2, 3, 4, 5, 6, 7, 8, 9, 10, 11, 12, or the like.

Unless otherwise specified, all embodiments and optional embodiments of the present application may be combined with each other to form a new technical solution.

Unless otherwise specified, all technical features and optional technical features of the present application may be combined with each other to form a new technical solution.

Unless otherwise specified, all steps of the present application may be performed sequentially or randomly, but preferably, performed sequentially. For example, a method includes steps (a) and (b), which means that the method may include steps (a) and (b) performed sequentially, or steps (b) and (a) performed sequentially. For example, the method mentioned may further include step (c), which means that step (c) may be added to the method in any order, for example, the method may include steps (a), (b) and (c), steps (a), (c) and (b), steps (c), (a) and (b), or the like.

Unless otherwise specified, words "comprising" and "containing" mentioned in the present application are open-ended or closed-ended. For example, the words "comprising" and "containing" may mean that other components that are not listed may further be comprised or contained, or only listed components may be comprised or contained.

In the present application, unless otherwise specified, the term "or" is inclusive. For example, the phrase "A or B" means "A, B or both A and B". More particularly, a condition "A or B" is satisfied by any one of the following: A is true (or present) and B is false (or not present); A is false (or not present) and B is true (or present); or both A and B are true (or present).

In a perovskite solar cell of a formal structure, 2,2',7,7'-tetrakis[N,N-di(4-methoxyphenyl)amino]-9,9'-spirobifluorene (Spiro-OMeTAD) material is usually adopted to fabricate a hole transport layer, and a lithium salt is added therein. However, a perovskite solar cell prepared by adopting a Spiro-OMeTAD material as a hole transport layer and a conventional material for passivating defects on the surface of perovskite has poor long-term stability. According to the inventors' speculation, a reason for this problem may be that a lithium ion has a small radius and can easily pass through a common passivation material to enter a perovskite layer. However, after entering the perovskite layer, the lithium ion cannot enter a crystal lattice, but stays in a bulk phase of perovskite, which causes the migration of other ions, and makes the performance and stability of perovskite decline simultaneously.

In view of the above problems, after in-depth research, the inventors of the present application propose a new passivation material, which can not only effectively passivate the surface defects of perovskite, but also prevent a lithium ion from passing through a passivation layer and entering a perovskite layer, thereby simultaneously ensuring the performance and long-term stability of a perovskite solar cell.

Therefore, a first aspect of the present application provides a perovskite solar cell, including conductive glass, a hole transport layer, a perovskite layer, an electron transport layer and a back electrode, where a passivation layer is disposed between the hole transport layer and the perovskite layer, and the passivation layer includes an amide and/or a cation thereof, where the amide includes a compound of formula (1) and/or formula (2):

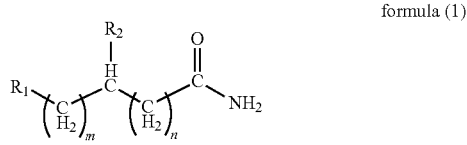

formula (1)

where $R_1$ and $R_2$ are each independently selected from hydrogen, —R, —NR$_2$, —NHR, —NH$_2$, —OH, —OR, —NHCOR, —OCOR, and —CH$_2$COOH, where R represents a straight or branched chain alkyl group having 1-10 carbon atoms, m is an integer of 0 to 10; and n is an integer of 1 to 10; and

formula (2)

where Ar is selected from a C5-C10 aryl or heteroaryl group, optionally, pyridine, pyran, thiopyran, benzene, naphthalene, quinoline, isoquinoline, pyrrole, pyrazole, pyrimidine, pyrazine, pyridazine, and isoindole.

In the present application, "a C5-C10 aryl or heteroaryl group" is an aryl or heteroaryl group having 5-10 carbon atoms, including, but not limited to, furan, thiophene, pyrrole, pyrazole, imidazole, triazole, tetrazole, oxazole, oxadiazole, oxatriazole, isothiazole, benzene, pyran, pyrone, thiopyran, pyridine, pyridazine, pyrimidine, pyrazine, piperidine, triazine, tetrazine, oxazine, indole, isoindole, indazole, benzimidazole, naphthalene, quinoline, isoquinoline, quinazoline, quinoxaline, pyridopyridine, etc.

It should be understood that although $R_1$ and $R_2$ are defined above in the present application, the present application is not intended to be limited thereto. $R_1$ and $R_2$ may also be independently selected from another aliphatic hydrocarbon (such as another alkyl group having 10 or more carbon atoms), an alkenyl group (such as an alkenyl group having 1-10 carbon atoms), an alkynyl group (such as an alkynyl group having 1-10 carbon atoms), an aromatic hydrocarbon (such as benzene, alkylbenzene, halogen-substituted benzene, nitro-substituted benzene, and phenol), a saturated or unsaturated cyclic hydrocarbon (such as cyclopentane, cyclohexane, and cyclohexene) or a group of heterocyclic compound (such as pyridine, pyrimidine, thiophene, and furan), or condensed ring compound (such as naphthalene, phenanthrene, pyrene, carbazole, and fluorene). These are also all within the scope of the concept of the present application and are included in the disclosure scope of the present application.

It should be understood that although the present application defines that the amide is the amide of formula (1) in some embodiments, the present application is not limited thereto. All possible amides (including the amide of formula (1) and other amides), amide polymers, amide derivatives, and any other substances from which the amides, the amide polymers, and the amide derivatives can be prepared (such as lactam) for a perovskite solar cell are all within the scope of the concept of the present application, and are also included in the disclosure scope of the present application, for example, but not limited to, the amide of formula (1), a derivative of the amide of formula (1), a polymer of the amide of formula (1), a hydrochloride of an amide, a cation of an amide, an anion of an amide, an alkene amide, an alkyne amide, an organophosphoramide, a poly amide, a polyolefin amide, a poly alkyne amide, or the like.

Herein, "the amide described in the present application" covers all possible amides (including the amide of formula (1) and other amides), amide polymers, amide derivatives, and any other substances from which the amides, the amide polymers, and the amide derivatives can be prepared for a perovskite solar cell.

In the present application, any substance including an "N—C(O)" group moiety is understood to be an amide covered by the present application.

The amide described in the present application has at least two effects of passivating perovskite and preventing a molecule or ion with a small radius from passing through. Therefore, it should be understood that in any occasion where passivating perovskite and/or preventing a molecule or ion with a small radius from passing through is required, the amides, the amide polymers, the amide derivatives and any other substances (such as lactam) from which the amides, the amide polymers, and the amide derivatives can be prepared disclosed in the present application can be used.

It should be understood that in the present application, the molecule or ion with the small radius may be selected as a lithium ion, but any other molecules or ions that can migrate to or pass through a layer material present in a perovskite solar cell are also included in the scope of the present application.

Furthermore, it should be understood that all perovskite solar cells that use amides, amide polymers, amide derivatives, and any other substances from which the amides, the amide polymers, and the amide derivatives can be prepared (such as lactam) to passivate perovskite and/or prevent a molecule or ion with a small radius from migration are also within the scope of the concept of the present application and included in the disclosure scope of the present application.

The structure of the perovskite solar cell described in the present application is introduced below, but the present application is not limited thereto.

Conductive Glass

Conductive glass usually has a certain degree of transparency. Generally, transparent conductive glass is used. Conductive glass usually consists of a glass substrate and an oxide thin film (TCO for short) conductive layer. Conventionally used TCOs include indium tin oxide (ITO) and fluorine-doped tin oxide (FTO), but the present application is not limited thereto. Conductive glass needs to be cleaned before use, such as being cleaned with detergent, deionized water and ethanol in ultrasound.

Conductive glass is used to conduct charge carriers out.

Electron Transport Layer

An electron transport layer can be prepared by a conventional technical means in the art. For example, tin oxide may be used to prepare the electron transport layer.

Optionally, a passivation layer may be disposed between the electron transport layer and a perovskite layer to passivate defects on an interface between the electron transport layer and the perovskite layer.

Perovskite Layer

A perovskite layer can be prepared by a conventional technical means in the art, and any perovskite used for preparing a solar cell in the art can be used.

Perovskite used for preparing the perovskite layer may have a chemical formula $ABX_3$, where A is methylamine (MA for short), formamidine (FA for short) or cesium (Cs), B is lead (Pb) or tin (Sn), optionally lead, and X is iodine (I) or bromine (Br).

In some optional embodiments, a lead-containing perovskite layer system is chosen to be used.

In some optional embodiments, a preparation method of the perovskite layer is as follows: irradiating a prepared battery preparation part optionally with an electron transport layer under UV for 15 minutes, adding 40-100 μL of perovskite solution on the battery preparation part (optionally, on the electron transport layer), optionally using a spin coater to spin at 1000-5000 rpm for 15-60 s, adding 100-1000 μL of chlorobenzene dropwise during the spinning at the 10-30$^{th}$ second, and then continuing to spin the spin coater for 5-30 s, and annealing a device at 80-180° C. for 5-60 min to obtain the perovskite layer.

In some optional embodiments, the perovskite solution may be formulated by using formamidine iodide (FAI), lead iodide (PbI$_2$), and chloromethylamine (MACl), and a solvent may be selected from N,N-dimethylformamide (DMF), dimethylsulfoxide (DMSO), N-methylpyrrolidone (NMP), γ-butyrolactone and a mixture thereof, but is not limited thereto. Optionally, in the perovskite solution, a concentration of the formamidine iodide (FAI) ranges from 0.8-1.5 mol/L, a concentration of the lead iodide (PbI$_2$) ranges from 0.8-2 mol/L, and a concentration of the chloromethylamine (MACl) ranges from 5-50% (based on a total weight of the perovskite solution). Optionally, after the perovskite solution has been formulated, filtration is performed, and supernatant is taken for later use.

Passivation Layer

In the perovskite solar cell described in the present application, a passivation layer is disposed between a hole transport layer and the perovskite layer, and the passivation layer includes an amide and/or a cation thereof described above.

In the present application, a straight or branched chain alkyl group having 1-10 carbon atoms may be selected from, for example, methyl, ethyl, propyl, butyl, pentyl, hexyl, heptyl, octyl, nonyl, decyl, isopropyl, isobutyl, tert-butyl, isopentyl, tert-pentyl, neopentyl, 2-methylpentyl, 3-methylpentyl, 2,2-dimethylbutyl, 2,3-dimethylbutyl, 2-methylhexyl, 3-methylhexyl, 2,2-dimethylpentyl, 3,3-dimethylpentyl, 2,3-dimethyl pentyl, 2,4-dimethylpentyl, 3-ethylpentyl, 2,2,3-trimethylbutyl, 2-methylheptyl, 3-methylheptyl, 4-methyl heptyl, 2,2-dimethylhexane, 3,3-dimethylhexane, 2,3-dimethylhexane, 2,4-dimethylhexane, 2,5-dimethylhexane, 3,4-dimethylhexane, 3-ethylhexane, 2,2,3-trimethylpentane, 2,2,4-trimethylpentane, 2,3,3-trimethylpentane, 2,3,4-trimethylpentane, 2-methyl-3-ethylpentane, 3-methyl-3-ethylpentane, and 2,2,3,3-tetramethylbutane, but is not limited thereto.

In addition to the above-mentioned effects, the use of an amide as a passivation material has at least the following advantages: first, a nitrogen atom on the amide has a strong ability to bind protons, so it is not easy to generate harmful hydrogen vacancy during use, thereby ensuring stability of passivation and efficiency of a device; in addition, oxygen on the amide can be well anchored with lead in perovskite (if there is lead), which fixes the structure of an iodide-lead octahedron, so as to stabilize a perovskite phase. Second, due to p-π conjugation, the amide has a strong electron cloud density, which can stabilize a lithium ion and prevent the lithium ion from migrating into the perovskite, so as to reduce the adverse effect of migration of the lithium ion on the long-term stability of the device.

In some embodiments, the passivation layer includes an amide cation of formula (3),

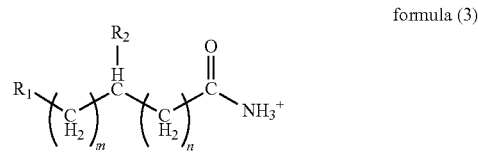

formula (3)

where R$_1$, R$_2$, m, and n are as defined above; and the passivation layer further includes an organic acid containing N, O, S and/or P, optionally N═O, S═O and/or P═O and/or a polymer of the organic acid, and/or an inorganic acid, and/or one or more anions thereof.

It should be understood that although the present application defines the cation of the amide as the cation of formula (3) in some embodiments, the present application is not limited thereto. It should be understood that any amide described in the present application may or may not have a cation and be used in the passivation layer. In addition, a cation (H$^+$) may be located at any chemically possible position of the amide described in the present application and may be one or two or more; in addition, the cation may be not only H$^+$, but also one or more of any other cations that can introduce the cation of the amide described in the present application, and/or one or more of any other cations that can modify the amide described in the present application. In addition, in the present application, the amide may have an anion, and there is no limitation on the type and amount of the anion attached to the amide, as long as it can exist chemically.

It should still be understood that although the present application defines an anion that may be used in the passivation layer in some embodiments, the present application is not limited thereto. All anions that can form an organic salt or an inorganic salt with the cation of the amide described in the present application and can be used for the perovskite solar cell are within the scope of the concept of the present application and are included in the disclosure scope of the present application. In addition, the anion described in the present application may also be one or more anions.

An anion has a certain influence on the passivation effect of an amide material in a perovskite solar cell. Although a common inorganic acid anion with high electronegativity can make up for the defect of an X site in perovskite (ABX$_3$), it will reduce an electron cloud density at the amide due to the strong electronegativity, so that an effect of fixing a lithium ion by the amide declines. However, the inventors of the present application have found that an organic acid containing N, O, S and/or P or a polymer of the organic acid or some specific inorganic acids (such as phosphoric acid and sulfamic acid) is similar to an amide cation and has certain effects of passivating defects and stabilizing a perovskite phase; in addition, a lone pair of electrons on N, O, S, and P have a certain effect on fixing a lithium ion, which has a positive impact on the long-term stability of the device. Therefore, optionally, an organic acid containing N, O, S, and P, especially containing N=O, S=O, and P=O, or a polymer of the organic acid or some specific inorganic acids are used in the present application to prepare the passivation layer between the hole transport layer and the perovskite layer.

In some optional embodiments, the passivation layer between the hole transport layer and the perovskite layer is prepared only from the above-mentioned amide and/or amide cation and/or the above-mentioned anion.

In some embodiments, the organic acid is selected from at least one of acetic acid, glycolic acid, oxalic acid, citric acid, ethylenediaminetetraacetic acid, maleic acid, acrylic acid, and organic phosphonic acid, and/or the inorganic acid is at least one selected from sulfamic acid and phosphoric acid.

In the present application, the organic phosphonic acid is a substance containing a phosphonic acid group directly connected to a carbon atom in a molecule, that is, a substance containing the following structure in the molecule,

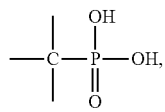

and the molecule may also contain hydroxyl, —CH$_2$, —COOH and other groups. According to the number of phosphonic acid groups in the molecule, the organic phosphonic acid may be divided into diphosphonic acid, triphosphonic acid, tetraphosphonic acid, pentaphosphonic acid, etc.

Using the above organic acid and/or inorganic acid to prepare the passivation layer between the hole transport layer and the perovskite layer can achieve better passivation of defects and stabilization of the perovskite phase.

In some embodiments, a ratio of a molar sum of the amide or the cation thereof to a molar sum of the organic acid and/or the polymer of the organic acid and/or the inorganic acid, and/or the anions thereof is 1:(1.0-1.5), optionally 1:(1.0-1.2).

In some embodiments, the passivation layer includes one or more anions having the following structural formulas:

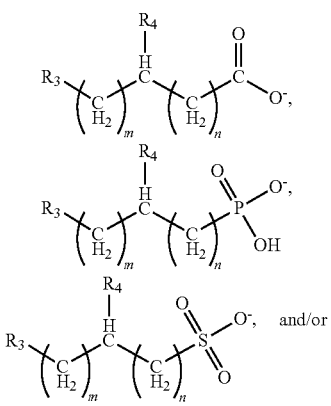

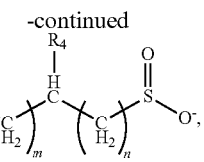

where $R_3$ and $R_4$ are each independently selected from hydrogen or a straight or branched chain alkyl group having 1-10 carbon atoms, m is an integer of 0-10, and n is an integer of 1-10.

It should be understood that although $R_3$ and $R_4$ are defined above in the present application, the present application is not intended to be limited thereto. $R_3$ and $R_4$ may also be independently selected from another aliphatic hydrocarbon (such as another alkyl group having 10 or more carbon atoms), an alkenyl group (such as an alkenyl group having 1-10 carbon atoms), an alkynyl group (such as an alkynyl group having 1-10 carbon atoms), an aromatic hydrocarbon (such as benzene, alkylbenzene, halogen-substituted benzene, nitro-substituted benzene, and phenol), a saturated or unsaturated cyclic hydrocarbon (such as cyclopentane, cyclohexane, and cyclohexene) or a group of heterocyclic compound (such as pyridine, pyrimidine, thiophene, and furan), or condensed ring compound (such as naphthalene, phenanthrene, pyrene, carbazole, and fluorene). These are also all within the scope of the concept of the present application and are included in the disclosure scope of the present application.

In some optional embodiments, the amide may be selected from one or more of butanamide, valeramide, 3-methylbutanamide, dodecylamide, octanamide, and nicotinamide. In some optional embodiments, the organic acid is selected from one or more of acrylic acid, oxalic acid, 2-methylpropionic acid, acetic acid, and formic acid.

In some embodiments, the passivation layer does not include a cyclic group, optionally does not include a cyclic group with a large pore diameter, such as a benzene ring.

The cyclic group includes any saturated or unsaturated cyclic group. For example, a group having a cyclic structure includes, for example, an aromatic ring such as benzene ring, thiophene, and pyridine, and further, an aliphatic ring (such as cycloheptane), a cyclic ether, and the like.

A group having a cyclic structure has a large pore diameter, so that a lithium ion can pass it through and enter the perovskite layer. In the perovskite solar cell described in the present application, the passivation layer between the hole transport layer and the perovskite layer adopts an alkyl chain instead of a group containing a cyclic structure, which can prevent the lithium ion from entering the perovskite layer through the passivation layer.

It should be understood that in the present application, the passivation layer may only contain the amide described in the present application, especially the amide of formula (1).

It should be understood that in the present application, the passivation layer may only contain the amide cation described in the present application and the anion described in the present application.

It should also be understood that in the present application, the passivation layer may include and only include the amide described in the present application, the amide cation described in the present application, and the amide anion described in the present application at the same time. In this case, there is no restriction on the proportions of amounts of the amide described in the present application, the amide cation described in the present application and the amide anion described in the present application in the passivation layer, as long as it conforms to the chemical law and is suitable for use in a solar cell.

It should still be understood that, in addition to the amide described in the present application, the amide cation described in the present application, and the amide anion described in the present application, the passivation layer may further include other materials that can be used in a solar cell, optionally other materials that do not contain a cyclic group, especially a benzene ring. In a case of including other materials, there is no restriction on the amount of the amide and the amount of the other materials described in the present application in the passivation layer, as long as it is suitable for use in a solar cell. In addition, in this case, there is also no restriction on the proportions of amounts of the amide described in the present application, the amide cation described in the present application and the amide anion described in the present application in the passivation layer, as long as it conforms to the chemical law and is suitable for use in a solar cell.

Hole Transport Layer

A hole transport layer is used to collect and extract a hole from the perovskite layer.

In some embodiments, the hole transport layer includes 2,2',7,7'-tetrakis[N,N-di(4-methoxyphenyl)amino]-9,9'-spirobifluorene (Spiro-OMeTAD), optionally a weight content of the 2,2',7,7'-tetrakis[N,N-di(4-methoxyphenyl)amino]-9,9'-spirobifluorene is 60-95%, optionally 70-85%, based on a total weight of the entire hole transport layer. It should be understood that although the present application defines the amount of Spiro-OMeTAD in the hole transport layer as the above-mentioned amount in some embodiments, the present application is not limited thereto. Other suitable amounts for use in a perovskite solar cell are also included within the disclosure scope of the present application.

The passivation layer described in the present application is particularly suitable for use between the hole transport layer including the Spiro-OMeTAD material described above and the perovskite layer.

In some embodiments, the hole transport layer includes, but is not limited to, a lithium salt, optionally, the lithium salt is lithium bis(trifluoromethanesulfonyl)imide, more optionally, a weight content of the lithium salt is 5-30%, optionally 8-15%, based on a total weight of the entire hole transport layer.

It should be understood that in the present application, an effect of adding a lithium salt to a hole transport layer is the same as that of adding a lithium salt conventionally in the art. In addition, although the lithium salt is defined above in some embodiments, the present application does not limit the type and added amount of the lithium salt that can be used in the hole transport layer, as long as it can play a beneficial role.

In a case that Spiro-OMeTAD is used as a hole transport material, since the material has a limited ability to conduct a hole, a lithium salt is usually added therein. However, solubility of the lithium salt in a solvent where Spiro-OMeTAD is present is low, so 4-tert-butylpyridine (tBP) is often added to increase its solubility. In addition, Spiro-OMeTAD may also be oxidized by adding a cobalt salt for oxidation to improve the ability of hole extraction. Optionally, the cobalt salt is tris[4-tert-butyl-2-(1H-pyrazol-1-yl)pyridine]cobalt (FK209).

It should be understood that although the present application is studied for a perovskite solar cell in which 2,2',7,7'-tetrakis[N,N-di(4-methoxyphenyl)amino]-9,9'-spirobifluorene (Spiro-OMeTAD) material is used to make a hole transport layer and a lithium salt is added thereto, the present application is not limited thereto. The passivation material described in the present application is suitable for use together with any hole transport layer, perovskite layer and/or electron transport layer, or even other passivation layers where migration of a molecule or ion with a small radius may occur.

It should be understood that although 2,2',7,7'-tetrakis[N,N-di(4-methoxyphenyl)amino]-9,9'-spirobifluorene (Spiro-OMeTAD) may be selected as a material of a hole transport layer for a perovskite solar cell in the present application, any other hole transport layer materials in which the addition of a lithium salt is required or lithium ion migration will take place are also particularly suitable for use together with the passivation material described in the present application, and thus are also within the scope of the concept and disclosure scope of the present application.

The hole transport layer can be prepared by a conventional technical means in the art.

Back Electrode

A back electrode may be a metal back electrode using a metal such as gold (Au), silver (Ag), and copper (Cu), but the present application is not limited thereto. The metal back electrode may be prepared by vapor deposition.

In some embodiments, the perovskite solar cell is a formal perovskite solar cell. In the present application, a "formal" structure of the perovskite solar cell should be understood as a structure including conductive glass, an electron transport layer, a perovskite layer, a hole transport layer and a back electrode successively from a light incident surface. In the formal perovskite solar cell described in the present application, conductive glass, an electron transport layer, a perovskite layer, a passivation layer, a hole transport layer, and a back electrode (optionally a metal back electrode) are included successively, where the passivation layer is located between the perovskite layer and the hole transport layer. Optionally, the passivation layer may also be disposed between the electron transport layer and the perovskite layer.

It should be understood that although the perovskite solar cell is defined as a formal structure in some embodiments, the present application is not limited thereto. A perovskite solar cell including the passivation material described in the present application is within the disclosure scope of the present application.

Preparation Method of Perovskite Solar Cell

A second aspect of the present application provides a method for preparing a perovskite solar cell, the method including a step of preparing a hole transport layer, a step of preparing a perovskite layer, and a step of preparing an electron transport layer, and a step of preparing a back electrode, where a passivation layer is disposed between the hole transport layer and the perovskite layer, and preparation of the passivation layer includes the following steps:

step S1: preparing or making a passivation material ready, the passivation material including an amide and/or a cation thereof, where the amide includes a compound of formula (1) and/or formula (2):

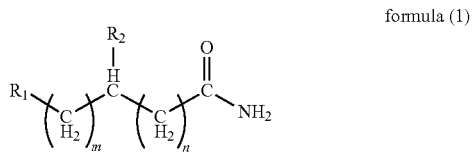

formula (1)

where
R$_1$ and R$_2$ are each independently selected from hydrogen, —R, —NR$_2$, —NHR, —NH$_2$, —OH, —OR, —NH-COR, —OCOR, and —CH$_2$COOH, where R represents a straight or branched chain alkyl group having 1-10 carbon atoms,
m is an integer of 0 to 10; and
n is an integer of 1 to 10; and

formula (2)

where Ar is selected from a C5-C10 aryl or heteroaryl group, optionally, pyridine, pyran, thiopyran, benzene, naphthalene, quinoline, isoquinoline, pyrrole, pyrazole, pyrimidine, pyrazine, pyridazine, and isoindole;
step S2: formulating a solution of the passivation material; and
step S3: coating the solution of the passivation material on perovskite, and then performing annealing to obtain the passivation layer.

Optionally, in the step S3, the passivation material is spread on a surface of the perovskite by spin coating. In some optional embodiments, a spin coating process includes spinning at a rotational speed of 1000-5000 rpm for 15-40 s. In some optional embodiments, an annealing process includes raising temperature to 80-120° C. and maintaining the annealing under the temperature for 5-30 min.

In some optional embodiments, the preparation of the passivation layer may include the following processes: the solution of the passivation material is added to the perovskite layer dropwise, and the passivation material is spread on a surface of the perovskite layer by spin coating, a spin coating process comprises spinning at a rotational speed of 1000-5000 rpm for 15-40 s, and then the passivation material is placed in a vacuum environment for 5-20 min, and a vacuum degree is optionally 0.01-0.2 MPa.

It should be understood that although the present application specifies that the passivation material is added to the perovskite layer "dropwise", the present application is not limited thereto, and all methods that can achieve this purpose can be used, and are within the disclosure scope of the present application.

In an optional embodiment, the method for preparing the perovskite solar cell includes a step of preparing a hole transport layer, a step of preparing a perovskite layer, a step of preparing an electron transport layer, and a step of preparing a back electrode, where a passivation layer is disposed between the hole transport layer and the perovskite layer, and preparation of the perovskite layer and the passivation layer includes the following steps:
step S1: preparing or making a passivation material ready, the passivation material including an amide and/or a cation thereof, where the amide has a structure of formula (1):

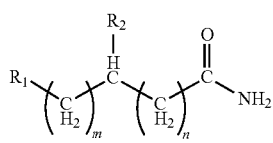

where
R$_1$ and R$_2$ are each independently selected from hydrogen, —R, —NR$_2$, —NHR, —NH$_2$, —OH, —OR, —NH-COR, —OCOR, and —CH$_2$COOH, where R represents a straight or branched chain alkyl group having 1-10 carbon atoms,
m is an integer of 0 to 10; and
n is an integer of 1 to 10; and
step S2': formulating a perovskite solution, and formulating a solution of the passivation material, and
step S3': adding 40-100 μL of the perovskite solution dropwise on a battery preparation part with the electron transport layer prepared in the step of preparing the electron transport layer, and optionally using a spin coater to spin at 1000-5000 rpm for 15-40 s, and adding 100-1000 μL of the prepared solution of the passivation material dropwise during spinning at 8-20$^{th}$ second; and then annealing the preparation part at 80-120° C. for 5-30 minutes to obtain the battery preparation part with the perovskite layer and the passivation layer.

In some optional embodiments, the passivation layer or the passivation material described in the step S1 includes an amide cation of formula (3),

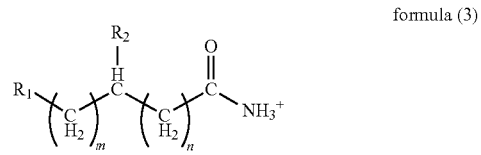

formula (3)

where R$_1$, R$_2$, m, and n are as defined above; and
the passivation layer described in the step S1 further includes an organic acid containing N, O, S and/or P, optionally N═O, S═O and/or P═O and/or a polymer of the organic acid, and/or an inorganic acid, and/or one or more anions thereof.

Optionally, in the step S1, the passivation material may be obtained commercially.

In some embodiments, in the preparation of the passivation layer, no other passivation material is used except the passivation material used in the step S1.

In some optional embodiments, the step S1 includes the following operations: dissolving the amide in a solvent and performing stirring, and adding the organic acid and/or the polymer of the organic acid, and/or the inorganic acid; optionally, the stirring is carried out in an ice water bath, and optionally, temperature of the stirring is maintained at 0-4° C. during the stirring. In some optional embodiments, reaction in the step S1 is carried out for 0.5-3 h.

In some optional embodiments, in the step S1, a ratio of a molar sum of the amide to a molar sum of the organic acid and/or the polymer of the organic acid and/or the inorganic acid is 1:(1.0-1.5), optionally 1:(1.0-1.2). Controlling the amount of the amide to be equal to or less than the molar weight of the organic acid and/or the polymer of the organic acid, and/or the inorganic acid is more conducive to treatment after the reaction.

In some embodiments, the step S1 includes the following operations:
(1) dissolving the amide in a solvent and performing stirring in an ice water bath; optionally, maintaining temperature at 0-4° C. during stirring;
(2) adding an organic acid, an inorganic acid and/or a polymer of the organic acid dropwise, optionally, continuing to react for 0.5-3 h after finishing the adding dropwise; and (3) optionally, drying, washing and drying a reaction product in (2) to obtain the passivation material.

In some optional embodiments, after the reaction is finished, the solvent is evaporated, washed and dried; optionally, the solvent is spin-dried by rotary evaporation; and optionally, diethyl ether or ethyl acetate is used for washing.

In some embodiments, in the step S2, a solvent for formulating the solution of the passivation material is selected from one or more of ethanol, isopropanol, n-butanol, ethyl acetate, chloroform, chlorobenzene, ethyl butyrate, dichlorobenzene, diethyl ether, toluene, and xylene, optionally, a concentration of the solution of the passivation material for preparing the passivation layer is 0.2-2.5 mg/ml, optionally 0.5-2.0 mg/ml.

In some optional embodiments, in the step S3, the solution of the passivation material is added to the perovskite layer dropwise, and then spin-coated statically or dynamically; after the spin coating is completed, optionally, the battery preparation part coated with the passivation material is annealed, and the annealing process is as follows: temperature is raised to 60-150° C., optionally 80-120° C., and maintained for a period of 5-30 min, optionally 8-15 min to obtain the battery preparation part with the passivation layer.

It should be understood that although the present application provides a preparation method of a perovskite solar cell and a preparation method of a passivation material in some embodiments, the present application is not limited thereto. Any method for preparing a passivation material of the present application and any method for preparing a perovskite solar cell including the passivation material of the present application are all within the disclosure scope of the present application.

EXAMPLES

Hereinafter, examples of the present application will be explained. The examples described below are exemplary and are merely for explaining the present application, and should not be construed as limiting the present application. Techniques or conditions that are not specified in examples are according to the techniques or conditions described in documents in the art or the product specification. Reagents or instruments used without being marked with the manufacturer are conventional products that are commercially available.

Example 3

Step 1: Preparation of Passivation Material

For specific preparation process, reference may be made to Table 1.

Step 2: Preparation of Perovskite Solar Cell

[Conductive Glass]

Conductive glass with a fluorine-doped tin oxide (FTO) film, which is commercially available, can be directly used after cleaning.

[Preparation of Electron Transport Layer]

A 15% tin oxide aqueous solution and deionized water were mixed in 1:3, and stirred at room temperature for 1 h, and 70 μL was taken to be spin-coated on a surface of FTO conductive glass for heating at 150° C. for 15 min to obtain a battery preparation part with an electron transport layer.

[Preparation of Perovskite Layer]

Formulation of a perovskite solution: 80 mg of formamidine iodide (FAI), 223 mg of lead iodide ($PbI_2$), and 15 mg of chloromethylamine (MACl) were dissolved in 1 mL of a solvent. The solvent was a mixed solvent of N,N-dimethylformamide (DMF) and dimethyl sulfoxide (DMSO), where a volume ratio of DMF to DMSO was 4:1 (DMF: DMSO). The perovskite solution was stirred at room temperature for 1 h with a magnetic stirrer and filtered, and supernatant was taken for later use.

Formamidine iodide (FAI), lead iodide ($PbI_2$) and chloromethylamine (MACl) were purchased from Xi'an Polymer Light Technology Corp., and DMF and DMSO were purchased from Sigma Corporation.

The battery preparation part with the electron transport layer obtained in the previous step was irradiated under UV for 15 minutes, and then 60 μL of the perovskite supernatant was added to the electron transport layer, and spinned for 30 s with a spin coater, and 300 μL of chlorobenzene was added dropwise at $15^{th}$ second, and then the spin coater continued to spin for 15 s, and the device was placed on a 100° C. hot plate for annealing for 10 min to obtain the battery preparation part having the electron transport layer and the perovskite layer successively.

[Preparation of Passivation Layer]

Formulation of a solution of a passivation material: isopropanol was used as a solvent, and the passivation material prepared in the step 1 was used. See Table 2 for the specific concentration.

The battery preparation part with the electron transport layer and the perovskite layer prepared in the previous step was placed on a spin coater, and then 60 μL of the formulated isopropanol solution of the passivation material was added dropwise to the perovskite layer, and spin-coated for 30 s, and then the device was placed on a 100° C. hot plate for annealing for 10 min to obtain the battery preparation part having the electron transport layer, the perovskite layer and the passivation layer successively.

[Preparation of Hole Transport Layer]

Formulation of a Lithium Containing Spiro-OMeTAD Solution:

Lithium bis(trifluoromethanesulfonyl)imide (Li-TFSI), 4-tert-butylpyridine (tBP), and tri(1,1,1-trifluoro-N-[(trifluoromethyl)sulfonyl]methanesulfonamide salt) (FK209) were added to Spiro-OMeTAD.

The specific process is as follows:

(1) formulating a Li-TFSI solution of which a solvent is acetonitrile, and a concentration is 520 mg/mL, and performing dissolution in ultrasound for 10 min for later use;

(2) formulating a FK209 solution of which a solvent is acetonitrile, and a concentration is 300 mg/mL;

(3) formulating a chlorobenzene solution of 2,2',7,7'-tetrakis[N,N-di(4-methoxyphenyl)amino]-9,9'-spirobifluorene (Spiro-OMeTAD) with a concentration of 73 mg/mL, and performing dissolution in ultrasonic for 10 min; and (4) adding 18 μL of the Li-TFSI solution, 30 μL of tBP and 29 μL of the FK209 solution to 1 mL of the chlorobenzene solution of Spiro-OMeTAD, performing stirring for 1 h, and then filtration for later use, to obtain a Spiro-OMeTAD solution.

Preparation of Hole Transport Layer:

60 μL of the lithium containing Spiro-OMeTAD solution was added dropwise to the passivation layer prepared in the previous step, and spin-coated at 3000 rpm for 30 s to obtain a hole transport layer.

[Preparation of Back Electrode]

According to a mask pattern, a razor blade was used to scrape part of functional layers (including the hole transport layer, the perovskite layer, the passivation layer, the electron transport layer, and a buffer layer) of the battery preparation part having conductive glass, the electron transport layer, the perovskite layer, the passivation layer and the hole transport layer successively prepared in the previous step to expose a conductive glass layer, and then residual functional layers were wiped off with a cleaning solution. The preparation part was put into an evaporation mask, and 80 nm silver was evaporated and plated at the exposed conductive glass in a vacuum evaporation device, with an evaporation rate of 0.1 A/s. A complete perovskite solar cell was obtained after evaporation.

A structure diagram of the prepared perovskite solar cell is shown in FIG. 1.

Examples 1-2

Examples 1-2 were carried out in a manner similar to Example 3, except that step 1 was omitted, and a passivation layer in step 2 used valeramide and hexanamide respectively. The two substances were purchased from Aladdin Company.

Examples 4-5

Examples 4-5 were carried out in a manner similar to Example 3, except the preparation of a passivation material in step 1, see Table 1.

Comparative Example 1

Comparative Example 1 was carried out in a manner similar to Example 1, except that step 1 was omitted and a passivation layer in step 2 used phenylethylamine.

TABLE 1

| | Preparation of Passivation Material | | |
|---|---|---|---|
| | Passivation material | Synthesis method | Post-treatment method |
| Example 3 | dodecylamide formate | dissolving dodecylamide in absolute ethanol, performing stirring in an ice water bath to maintain temperature at 0-4° C., adding formic acid dropwise (a molar ratio of dodecylamide to formic acid is 1:1.1), and continuing to react for 0.5-3 h after the adding dropwise | spinning the solvent dry, washing it with ether for many times, and putting it into an oven for drying at 60° C. for 3 h |
| Example 4 | octylamide acetate | dissolving octylamide in absolute ethanol, performing stirring in an ice water bath to maintain temperature at 0-4° C., adding acetic acid dropwise (a molar ratio of octylamide to acetic acid is 1:1.1), and continuing to react for 0.5-3 h after the adding dropwise | spinning the solvent dry, washing it with ether for many times, and putting it into an oven for drying at 60° C. for 3 h |
| Example 5 | niacinamide acrylate | dissolving nicotinamide in absolute ethanol, performing stirring in an ice water bath to maintain temperature at 0-4° C., adding acrylic acid dropwise (a molar ratio of nicotinamide to acrylic acid is 1:1.1), and continuing to react for 0.5-3 h after the adding dropwise | spinning the solvent dry, washing it with ether for many times, and putting it into an oven for drying at 60° C. for 3 h |

Performance Test

1. Measurement of Photoelectric Conversion Efficiency

Test was carried out according to the national standard IEC61215, in which the test was carried out under the condition of light illumination, and using a digital source meter, where a light source was provided by a solar simulator, and light emitted by the light source conforms to AM 1.5G standard solar spectrum.

2. Stability Test

Photoelectric conversion efficiency of a perovskite solar cell prepared in Examples and Comparative Example was measured on the 3rd day and the 30th day, respectively.

TABLE 2

Performance Test Results

| | Passivation material | Concentration (mg/mL) | Efficiency on the 3rd day (%) | Efficiency on the 30th day (%) |
|---|---|---|---|---|
| Comparative Example 1 | p-fluorophenyl-ethylamine | 0.0 | 19.01 | 18.52 |
| | | 0.5 | 19.55 | 19.35 |
| | | 1.0 | 19.62 | 19.44 |
| | | 1.5 | 19.21 | 19.01 |
| | | 2.0 | 18.89 | 18.72 |
| Example 1 | valeramide | 0.5 | 19.85 | 19.95 |
| | | 1.0 | 20.01 | 20.06 |
| | | 1.5 | 19.66 | 19.80 |
| | | 2.0 | 18.85 | 18.91 |
| Example 2 | hexanamide | 0.5 | 19.92 | 20.05 |
| | | 1.0 | 20.21 | 20.12 |
| | | 1.5 | 19.65 | 19.66 |
| | | 2.0 | 18.55 | 18.56 |
| Example 3 | dodecylamide formiate | 0.5 | 21.88 | 22.01 |
| | | 1.0 | 22.03 | 22.32 |
| | | 1.5 | 22.32 | 22.68 |
| | | 2.0 | 21.01 | 21.56 |
| Example 4 | octylamide acetate | 0.5 | 21.65 | 21.88 |
| | | 1.0 | 21.42 | 21.56 |
| | | 1.5 | 22.01 | 22.55 |
| | | 2.0 | 20.12 | 21.01 |
| Example 5 | niacinamide acrylate | 0.5 | 21.88 | 21.66 |
| | | 1.0 | 21.65 | 21.56 |
| | | 1.5 | 22.09 | 21.77 |
| | | 2.0 | 21.53 | 21.38 |

It can be seen from Table 2 that, compared with preparing a passivation layer between a hole transport layer and a perovskite layer with p-fluorophenylethylamine in Comparative Example 1, preparing a passivation layer with 0.5-2.0 mg/ml, especially 0.5-1.5 mg/ml of an amide or an amide cation described in the present application can significantly improve photoelectric conversion efficiency of a perovskite solar cell, especially long-term stability. In addition, it can also be seen that in Example 5, photoelectric conversion efficiency of a perovskite solar cell obtained by preparing a passivation layer with niacinamide acrylate containing a cyclic group is higher, but long-term stability is slightly reduced compared with Examples 1-4.

It should be noted that the present application is not limited to the foregoing embodiments. The foregoing embodiments are merely examples, and embodiments having substantially the same constitution as the technical idea and exerting the same effects within the technical solution of the present application are all included within the technical scope of the present application. In addition, various modifications made to the embodiments that are easily thought of by persons skilled in the art without departing from the spirit of the present application, and other embodiments that are constructed by combining some of the constituent elements of the embodiments are also included in the scope of the present application.

What is claimed is:

1. A perovskite solar cell, comprising conductive glass, a hole transport layer, a perovskite layer, an electron transport layer and a back electrode, wherein a passivation layer is disposed between the hole transport layer and the perovskite layer, and the passivation layer comprises an amide and/or a cation thereof, wherein the amide comprises a compound of formula (1) and/or formula (2):

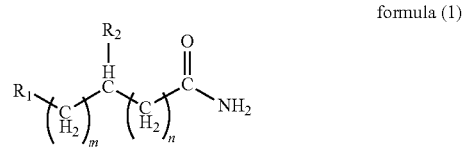

formula (1)

wherein

R$_1$ and R$_2$ are each independently selected from hydrogen, —R, —NR$_2$, —NHR, —NH$_2$, —OH, —OR, —NH-COR, —OCOR, and —CH$_2$COOH, wherein R represents a straight or branched chain alkyl group having 1-10 carbon atoms, m is an integer of 0 to 10; and n is an integer of 1 to 10; and

formula (2)

wherein Ar is selected from a C5-C10 aryl or heteroaryl group.

2. The perovskite solar cell according to claim 1, wherein the passivation layer comprises an amide cation of formula (3),

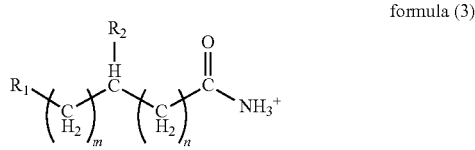

formula (3)

wherein R$_1$, R$_2$, m, and n are as defined in claim 1; and the passivation layer further comprises an organic acid containing N, 0, S and/or P, and/or a polymer of the organic acid, and/or an inorganic acid, and/or one or more anions thereof.

3. The perovskite solar cell according to claim 2, wherein the organic acid is selected from at least one of acetic acid, glycolic acid, oxalic acid, citric acid, ethylenediaminetetraacetic acid, maleic acid, acrylic acid, and organic phosphoric acid, and/or the inorganic acid is at least one selected from sulfamic acid and phosphoric acid.

4. The perovskite solar cell according to claim 2, wherein a ratio of a molar sum of the amide or the cation thereof to a molar sum of the organic acid and/or the polymer of the organic acid and/or the inorganic acid, and/or the anions thereof is 1:1.0 to 1:1.5.

5. The perovskite solar cell according to claim 2, wherein a ratio of a molar sum of the amide or the cation thereof to a molar sum of the organic acid and/or the polymer of the organic acid and/or the inorganic acid, and/or the anions thereof is 1:1.0 to 1:1.2.

6. The perovskite solar cell according to claim 1, wherein the passivation layer comprises one or more anions having the following structural formulas:

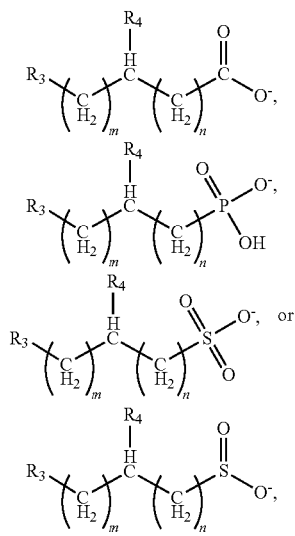

wherein $R_3$ and $R_4$ are each independently selected from hydrogen or a straight or branched chain alkyl group having 1-10 carbon atoms, m is an integer of 0-10, and n is an integer of 1-10.

7. The perovskite solar cell according to claim 1, wherein the passivation layer does not comprise a cyclic group.

8. The perovskite solar cell according to claim 1, wherein the hole transport layer comprises 2,2',7,7'-tetrakis[N,N-di(4-methoxyphenyl)amino]-9,9'-spirobifluorene, optionally a weight content of the 2,2',7,7'-tetrakis[N,N-di(4-methoxyphenyl)amino]-9,9'-spirobifluorene is 60-95% based on a total weight of the hole transport layer.

9. The perovskite solar cell according to claim 1, wherein the hole transport layer comprises a lithium salt, the lithium salt is lithium bis(trifluoromethanesulfonyl)imide, and a weight content of the lithium salt is 5-30% based on a total weight of the hole transport layer.

10. The perovskite solar cell according to claim 1, wherein the perovskite solar cell is a tbrmal perovskite solar cell.

11. The perovskite solar cell according to claim 1, wherein the passivation layer comprises an amide cation of formula (3),

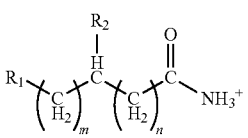

formula (3)

wherein $R_1$, $R_2$, m, and n are as defined in claim 1; and the passivation layer further comprises an organic acid containing N=O, S+O and/or P=O and/or a polymer of the organic acid, and/or an inorganic acid, and/or one or more anions thereof.

12. A method for preparing a perovskite solar cell, the method comprising a step of preparing a hole transport layer, a step of preparing a perovskite layer, a step of preparing an electron transport layer, and a step of preparing a back electrode, wherein a passivation layer is disposed between the hole transport layer and the perovskite layer, and preparation of the passivation layer comprises the following steps:

step S1: preparing or making a passivation material ready, the passivation material comprising an amide and/or a cation thereof, wherein the amide comprises a compound of formula (1) and/or formula (2):

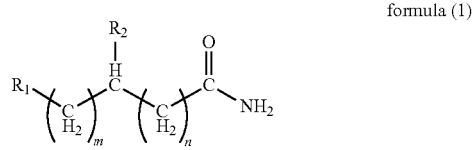

formula (1)

wherein
$R_1$ and R2 are each independently selected from hydrogen, —R, —NR$_2$, —NH$_2$, —OH, —OR, —NHCOR, —OCOR, and —CH$_2$COOH, wherein R represents a straight or branched chain alkyl group having 1-10 carbon atoms,
m is an integer of 0 to 10; and
n is an integer of 1 to 10; and

formula (2)

wherein Ar is selected from a C5-C10 aryl or heteroaryl group;
step S2: formulating a solution of the passivation material; and
step S3: coating the solution of the passivation material on the perovskite layer, and then performing annealing to obtain the passivation layer.

13. The method for preparing the perovskite solar cell according to claim 12, wherein in the preparation of the passivation layer, no other passivation material is used except the passivation material prepared in the step S1.

14. The method for preparing the perovskite solar cell according to claim 12, wherein the step S1 comprises the following operations:
(1) dissolving the amide in a solvent and performing stirring in an ice water bath; optionally, maintaining temperature at 0-4° C. during stirring;
(2) adding an organic acid, an inorganic acid and/or a polymer of the organic acid dropwise, optionally, continuing to react for 0.5-3 h after finishing the adding dropwise; and
(3) optionally, drying, washing and drying a reaction product in (2) to obtain the passivation material.

15. The method for preparing the perovskite solar cell according to claim 12, wherein in the step S2, a solvent for formulating the solution of the passivation material is selected from one or more of ethanol, isopropanol, n-butanol, ethyl acetate, chloroform, chlorobenzene, ethyl butyrate, dichlorobenzene, diethyl ether, toluene, and xylene, optionally, a concentration of the solution of the passivation material for preparing the passivation layer is 0.2-2.5 mg/ml.

16. The method for preparing the perovskite solar cell according to claim 12, wherein in the step S3, the solution of the passivation material is added to the perovskite layer, and the passivation material is spread on a surface of the perovskite layer by spin coating, a spin coating process comprises spinning at a rotational speed of 1000-5000 rpm for 15-40 s, and then the passivation material is placed in a vacuum environment for 5-20 min, and a vacuum degree is optionally 0.01-0.2 MPa.

\* \* \* \* \*